(12) United States Patent
Uratani et al.

(10) Patent No.: US 7,946,799 B2
(45) Date of Patent: May 24, 2011

(54) TRANSFER APPARATUS

(75) Inventors: Takafumi Uratani, Osaka (JP); Daisuke Sado, Osaka (JP); Hideki Matsuo, Osaka (JP)

(73) Assignee: DAIHEN Corporation, Osaka (JP)

( * ) Notice: Subject to any disclaimer, the term of this patent is extended or adjusted under 35 U.S.C. 154(b) by 446 days.

(21) Appl. No.: 12/079,121

(22) Filed: Mar. 25, 2008

(65) Prior Publication Data

US 2008/0237172 A1 Oct. 2, 2008

(30) Foreign Application Priority Data

Mar. 30, 2007 (JP) .................................. 2007-092967

(51) Int. Cl.
B25J 18/04 (2006.01)

(52) U.S. Cl. ............... 414/744.3; 74/490.01; 414/749.1; 901/15

(58) Field of Classification Search ............... 414/744.6, 414/744.3, 718, 728, 749.1; 901/15; 74/23, 74/25, 424.71, 841, 490.01
See application file for complete search history.

(56) References Cited

U.S. PATENT DOCUMENTS

| | | | | |
|---|---|---|---|---|
| 4,298,128 A * | 11/1981 | Gattu | ............................. | 212/348 |
| 5,135,349 A * | 8/1992 | Lorenz et al. | ............... | 414/744.6 |
| 5,899,653 A * | 5/1999 | Brodine | .................... | 414/222.04 |
| 6,371,713 B1 * | 4/2002 | Nishimura et al. | ....... | 414/222.13 |
| 6,520,733 B1 * | 2/2003 | Taniyama et al. | .......... | 414/749.5 |

FOREIGN PATENT DOCUMENTS

JP 2005-186259 7/2005

* cited by examiner

*Primary Examiner* — Donald Underwood
(74) *Attorney, Agent, or Firm* — Hamre, Schumann, Mueller & Larson, P.C.

(57) ABSTRACT

A transfer apparatus includes a fixed base, a swivel, a lift mechanism for raising and lowering the swivel relative to the fixed base, a swivel mechanism for turning the swivel about a vertical swivel axis, a linear movement mechanism supported by the swivel, and a hand supported by the linear movement mechanism for transportation of a work along a linear horizontal travel stroke. The lift mechanism includes N (N is an integer equal to or greater than 2) lift members arranged for telescopic expansion and retraction relative to the fixed base. The lift mechanism also includes N lift drive mechanisms each for raising and lowering one of the lift members relative to an immediate lower-stage lift member. The swivel is supported by an uppermost one of the lift members. (FIG. 5)

15 Claims, 11 Drawing Sheets

TRANSFER APPARATUS

BACKGROUND OF THE INVENTION

1. Field of the Invention

The present invention relates to a transfer apparatus, in particular, to a transfer apparatus which is capable of carrying a thin, plate-like work such as a substrate, along a straight path.

2. Description of the Related Art

A transfer apparatus for carrying a thin platy work is disclosed in JP-A-2005-186259, for example. The conventional transfer apparatus includes a swivel and a pair of link arm mechanisms (linear movement mechanisms) provided thereon. Each of the link arm mechanisms has its end portion provided with a hand which is capable of holding a platy work such as a substrate horizontally. The swivel is supported by a cylindrical lift base (lift member) which can be raised and lowered relative to a fixed base. The lift base is raised or lowered in order to move the hand which is supported by the swivel to a predetermined height. As the swivel turns on the fixed base, about a vertical axis, the pair of link arm mechanisms rotate therewith, and as the link arm mechanisms swing to open, the platy works held by the hands are moved linearly on a horizontal plane, transporting the platy works from a predetermined location to another location.

The transfer apparatus which includes such a linear movement mechanism as the above is used in manufacturing processes of semiconductor devices or liquid crystal display panels for example, in order to move a work in and out of process chambers. When carrying a work in and out of different process chambers, the carrying process can be achieved by a chain of transportation operations for example, via a vacuum transportation module which is disposed between an atmospheric transport module and each process chamber. The vacuum transport module includes a transport chamber surrounded by a plurality of process chambers, and a load lock which connects the atmospheric transport module with the transport chamber. In the transport chamber, there is disposed a transfer apparatus which is of the type described above and is capable of operating in a vacuum environment. The transfer apparatus receives a work in the load lock, transports the work into the transport chamber, and then into one of the process chambers while receiving a processed work from the process chamber and moving it to the load lock. In the load lock, there is a stage for placing a work, and the work is delivered to and picked from this stage.

In recent years, the stage in the load lock sometimes has three or more tiers for a purpose of improved efficiency, for example, in the manufacturing process. When the transfer apparatus is used in a load lock equipped with such a multi-tiered stage, the lift base must have an increased lift stroke. However, increasing the stroke generally leads to a consequence that the lift base's vertical (height direction) dimension is increased, as well as the height dimension of the fixed base which supports the lift base. This leads to an undesirable trend of overall increase in the size of the transfer apparatus.

SUMMARY OF THE INVENTION

The present invention has been proposed under the above-described circumstances, and it is therefore an object of the present invention to provide a transfer apparatus which is short (i.e., small in height) and capable of providing an increased stroke for the raising/lowering operation.

The present invention provides a transfer apparatus which includes: a fixed base; a swivel; a lift mechanism for raising and lowering of the swivel relative to the fixed base; a swivel mechanism for rotating the swivel about a vertical swivel axis; a linear movement mechanism supported by the swivel; and a hand supported by the linear movement mechanism for transportation of a work along a linear horizontal travel stroke. The lift mechanism includes: N (N represents an integer; the same to be applied hereinafter) lift members arranged for telescopic expansion and retraction relative to the fixed base; and N lift drive mechanisms each for raising and lowering of one of the lift members relative to its immediate lower-stage member. With the above arrangement, the swivel is supported by an uppermost one of the lift members.

Preferably, the lift mechanism has a two-stage construction including a lower-stage first lift member and an upper-stage second lift member. The lift mechanism includes a first lift drive mechanism which raises and lowers the first lift member relative to the fixed base; and a second lift drive mechanism which raises and lowers the second lift member relative to the first lift member while allowing the first lift member to be raised and lowered relative to the fixed base.

Preferably, the first lift drive mechanism includes a vertical threaded shaft supported by the fixed base, and a nut threaded on the threaded shaft and integral with the first lift member.

Preferably, the second lift drive mechanism includes: a rotation shaft supported by the fixed base; a threaded shaft supported in parallel to the rotation shaft by the first lift member; a transmission member held at a lower end of the first lift member incapably of axial relative movement thereto, around the rotation shaft incapably of relative rotation but capably of relative axial movement thereto, for transmission of rotation of the rotation shaft to the threaded shaft; and a nut threaded on the threaded shaft and being integral with the second lift member.

Preferably, the rotation shaft is provided by a spline shaft, and the transmission member has a spline boss to be fitted by the spline shaft.

Preferably, the fixed base is provided with a first and a second drive power sources near a bottom for driving the first and the second lift drive mechanisms.

Preferably, the threaded shaft of the first lift drive mechanism has a lower end provided with a pulley, and is connected with the first drive power source via a belt routed around the pulley.

Preferably, the rotation shaft of the second lift drive mechanism has a lower end provided with a pulley, and is connected with the second drive power source via a belt routed around the pulley.

Preferably, the first lift drive mechanism includes a plurality of the threaded shafts. These threaded shafts are disposed substantially in uniform dispersion in a circumferential direction of the swivel axis, and the first lift member is provided with a plurality of nuts corresponding to the threaded shafts.

Preferably, the swivel mechanism includes: a primary rotation shaft supported by the fixed base; a secondary rotation shaft supported in parallel to the primary rotation shaft by the first lift member; a drive rotation shaft supported in parallel to the secondary rotation shaft by the second lift member; a first transmission member held by the first lift member incapably of axial relative movement thereto, around the primary rotation shaft incapably of relative rotation but capably of relative axial movement thereto, for transmission of rotation of the primary rotation shaft to the secondary rotation shaft; and a second transmission member held by the second lift member incapably of axial relative rotation thereto, around the secondary rotation shaft incapably of relative rotation but capably of relative axial movement thereto, for transmission of rotation of the secondary rotation shaft to the drive rotation shaft.

Preferably, the device further includes: a first bellows between the fixed base and the first lift member for air-tight sealing between the fixed base and the first lift member regardless of raising/lowering movement of the first lift member relative to the fixed base; and a second bellow between the first lift member and the second lift member for air-tight sealing between the first lift member and the second lift member regardless of raising/lowering movement of the second lift member relative to the first lift member.

DETAILED DESCRIPTION OF THE PREFERRED EMBODIMENTS

Figure 1:
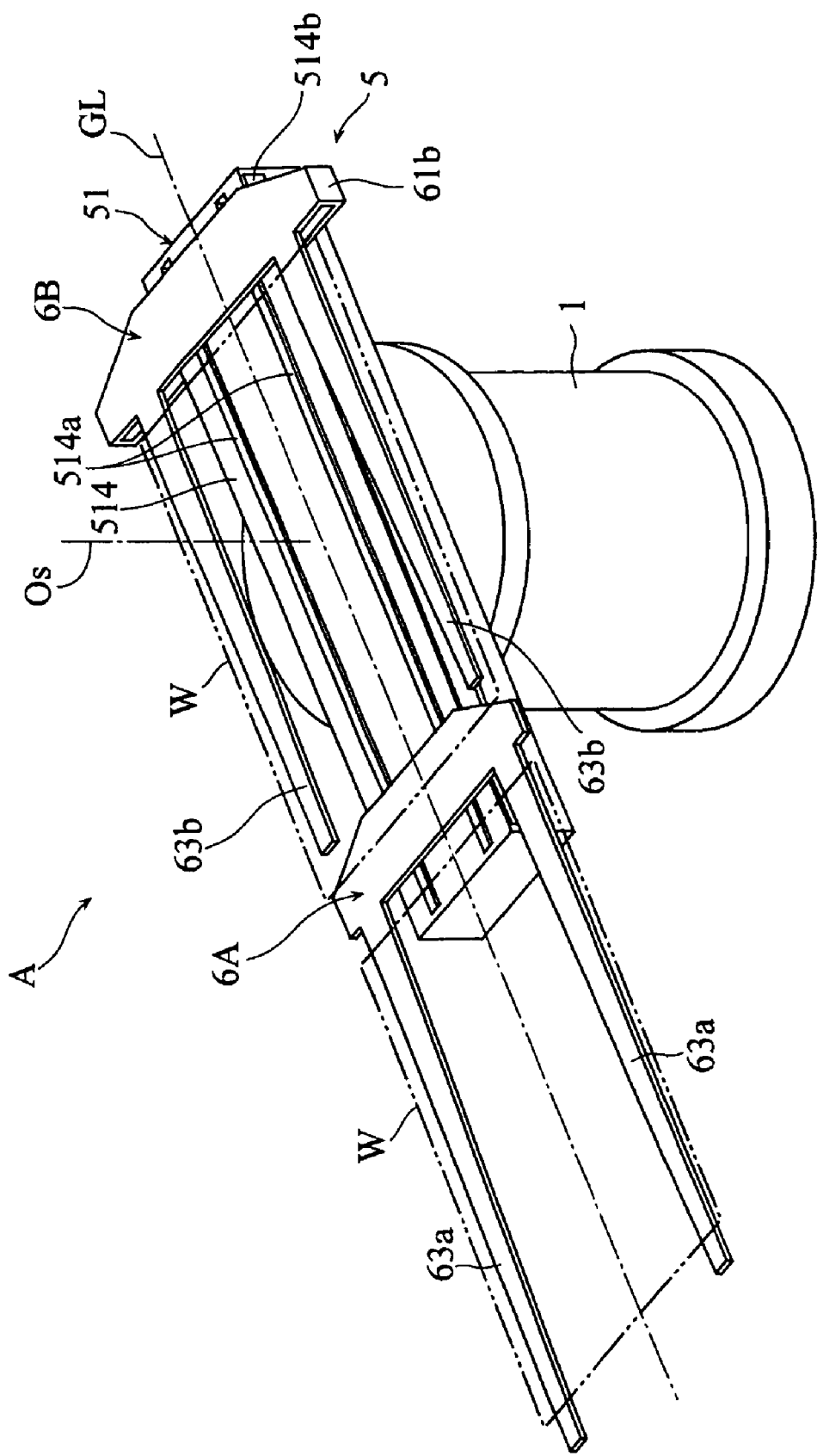
FIG. 1 is an overall perspective view of a transfer apparatus according to the present invention.

Preferred embodiments of the present invention will be described below with reference to the drawings.

FIG. 1 through FIG. 12 show a transfer apparatus according to the present invention. The transfer apparatus A is for transporting a thin platy work such as a substrate for a liquid crystal display panel. As shown in FIG. 1 through FIG. 5, the transfer apparatus A includes a fixed base 1, a swivel 2, a lift mechanism 3 which raises and lowers the swivel 2 relative to the fixed base 1, and a swivel mechanism 4 (See FIG. 7 through 9) which turns the swivel 2 about a swivel axis Os. The swivel 2 supports linear movement mechanisms 5. The linear movement mechanisms 5 support a pair of hands 6A, 6B independently from each other. The hands 6A, 6B are to hold the thin platy work W in a horizontal manner.

Figure 5:
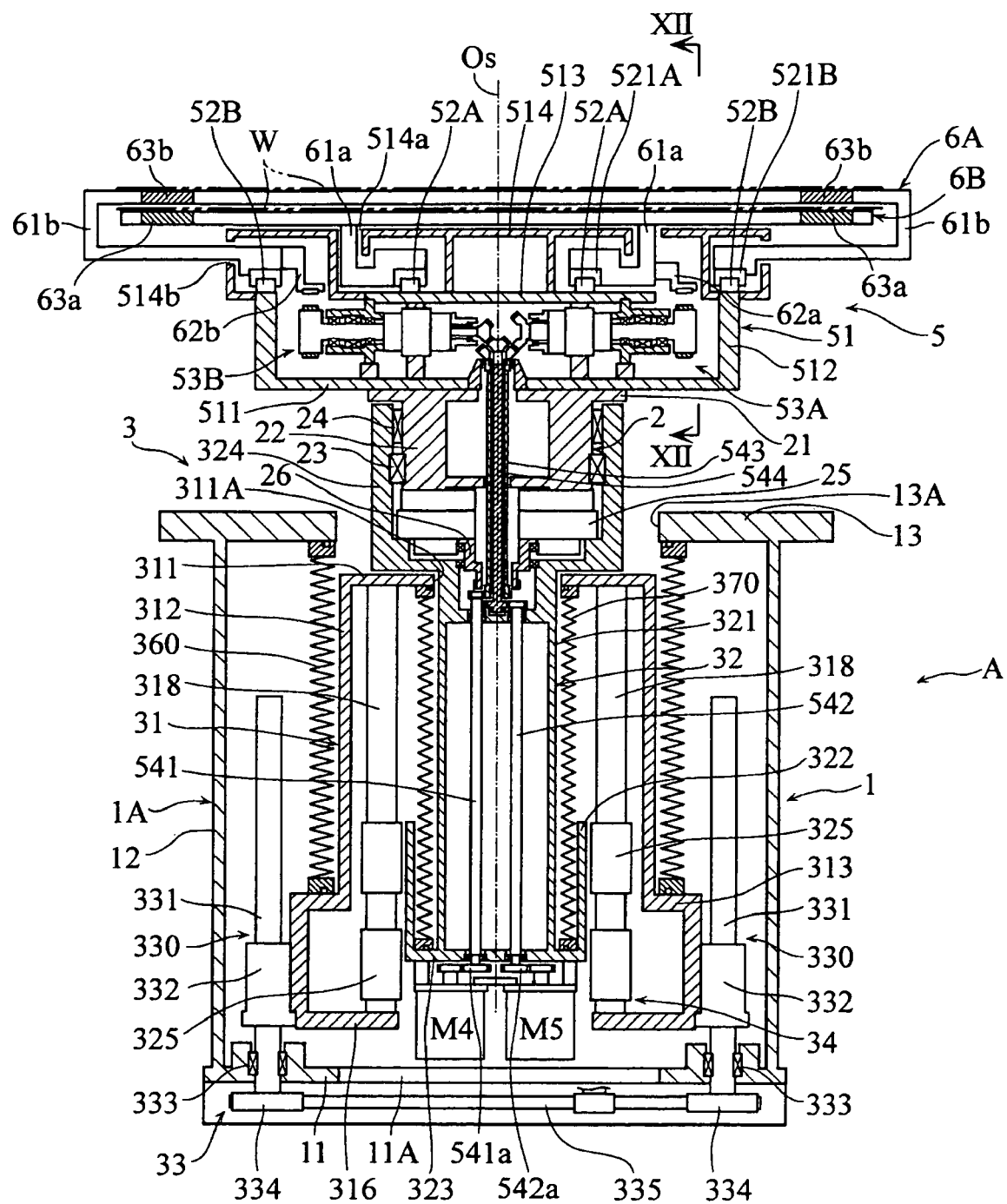
FIG. 5 is a sectional view taken along lines V-V in FIG. 2.
Figure 7:
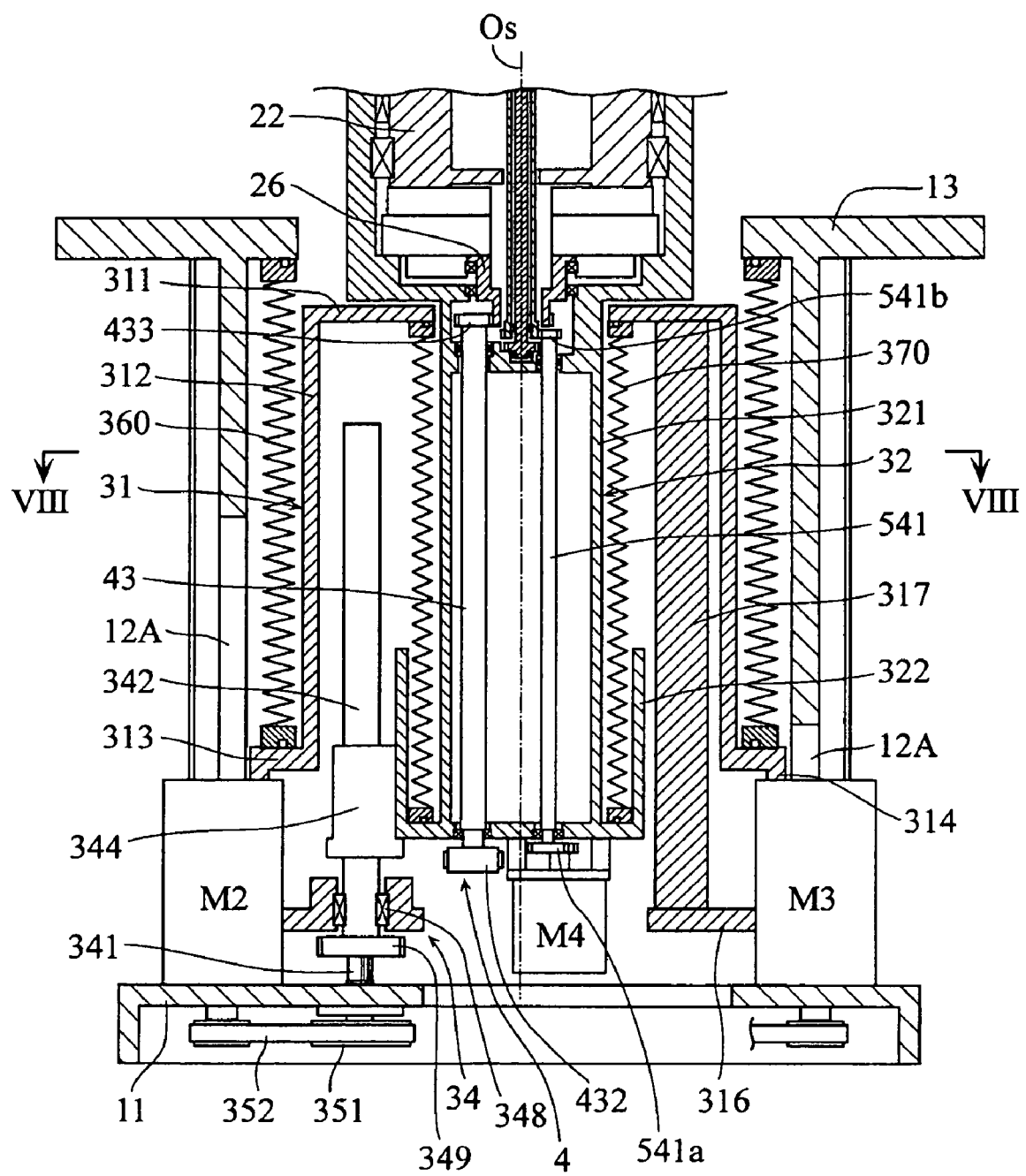
FIG. 7 is a partial sectional view taken along lines VII-VII in FIG. 2.
Figure 8:
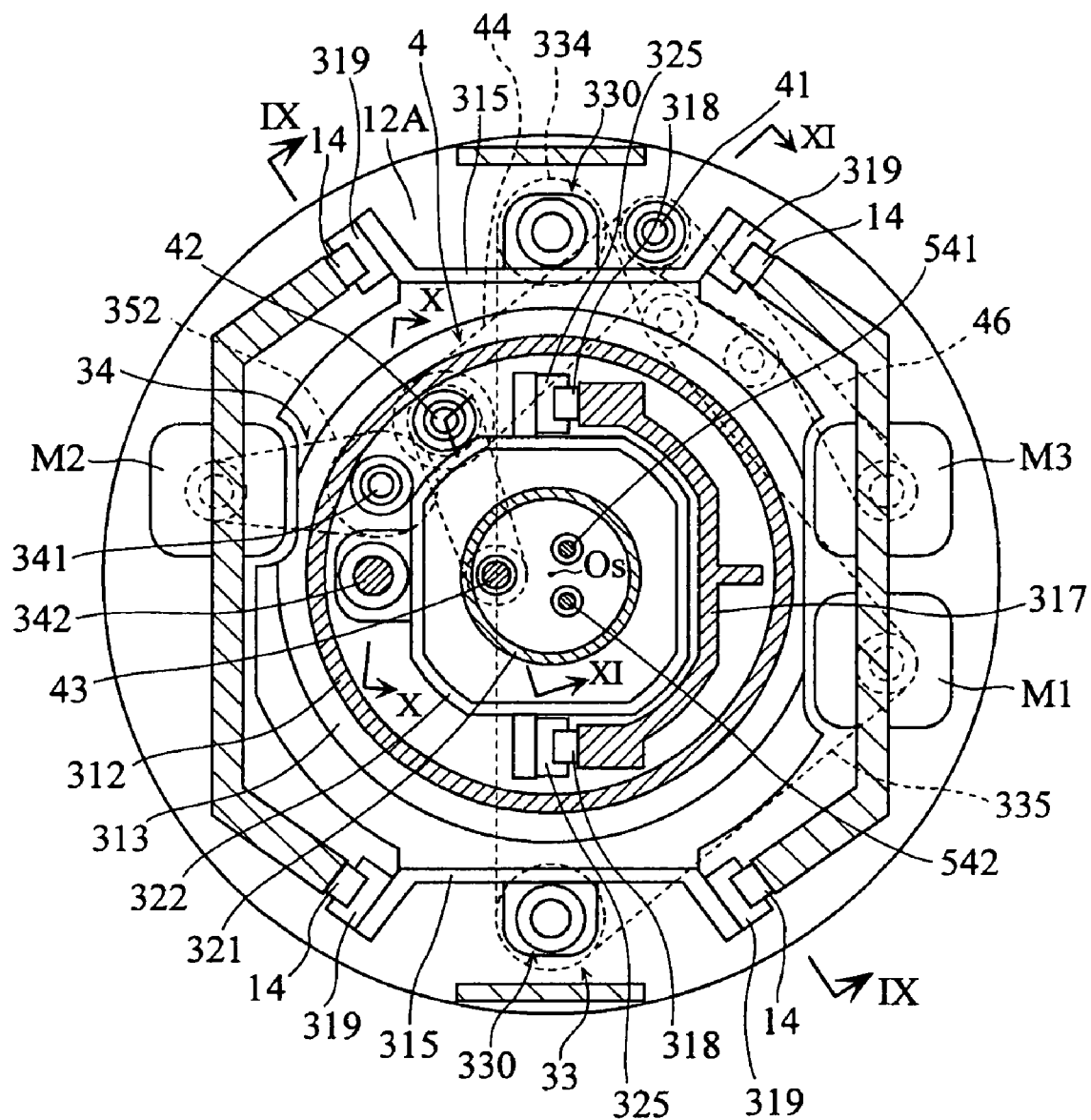
FIG. 8 is a sectional view taken along lines VIII-VIII in FIG. 7.
Figure 9:
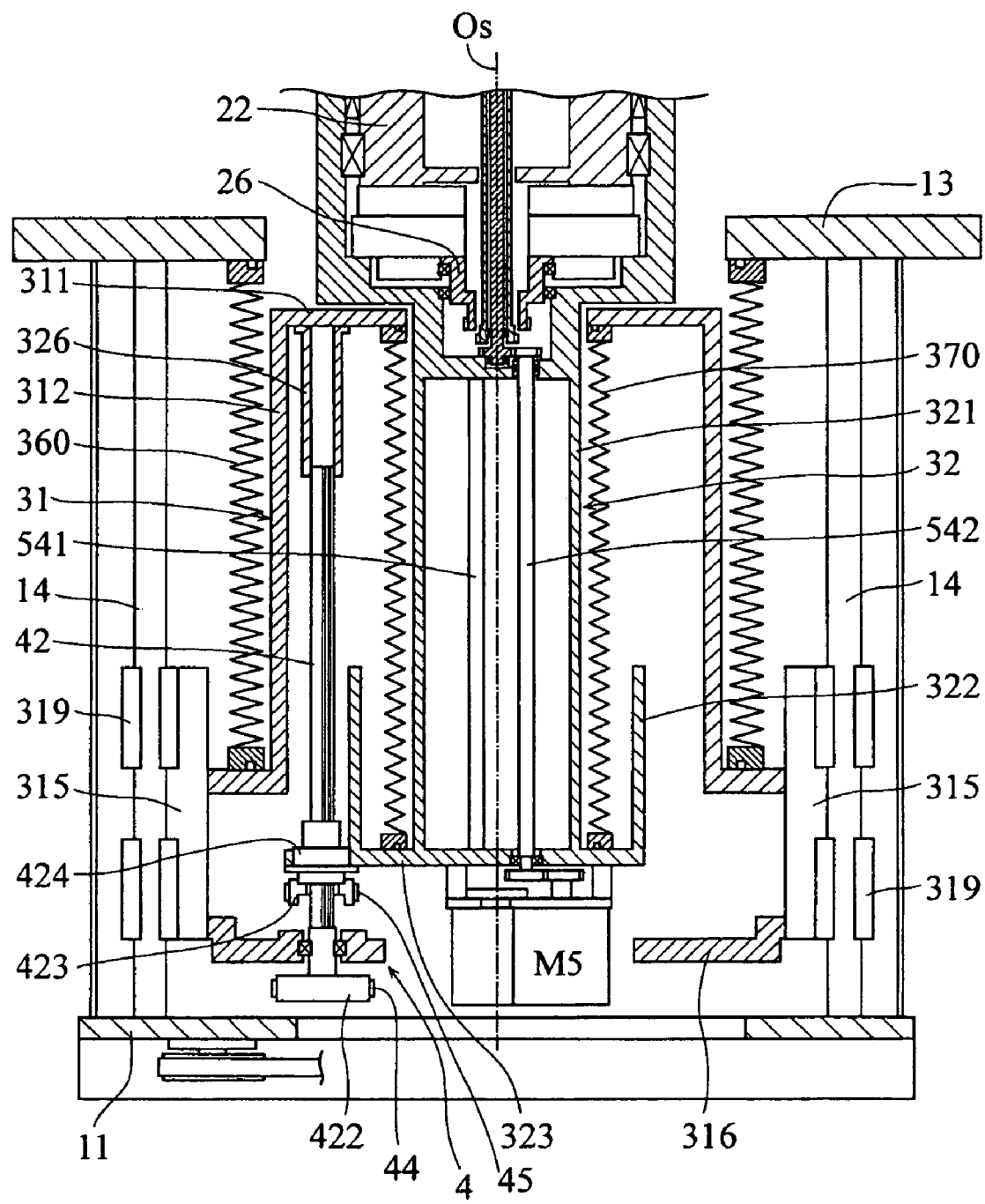
FIG. 9 is a partial sectional view taken along lines IX-IX in FIG. 8.

As shown clearly in FIG. 5, the fixed base 1 includes a housing 1A which has a substantially columnar shape defined by a bottom wall portion 11, a cylindrical side wall portion 12, and a ceiling wall portion 13. The ceiling wall portion 13 has a center hole 13A. The bottom wall portion 11, which has a hole 11A in the center, serves as a mount for drive power sources or motors as well as for various shafts of the lift mechanism 3 and the swivel mechanism 4 to be described later. As shown in FIG. 7, the side wall portion 12 has a number of openings 12A at appropriate places in order to facilitate installation of the motors as well as various maintenance operations for the motors from outside. As shown in FIG. 8 and FIG. 9, the side wall portion 12 of the housing 1A is provided with a plurality of vertical linear guide rails 14 for vertical sliding movement of a first lift member 31 to be described later.

The lift mechanism 3 has a two-staged structure including a first and a second lift members 31, 32 which telescopically expend and retract relative to the fixed base 1, and a first and a second lift drive mechanisms 33, 34 which raise and lower these lift members 31, 32 independently from each other. The first lift member 31 is a member which assumes a lower stage in a rising cycle of the swivel 2 while the second lift member 32 is a member which assumes an upper stage in the rising cycle.

As shown in FIG. 5 through FIG. 9, the first lift member 31 includes an upper wall portion 311, a cylindrical side wall portion 312 which has a predetermined vertical dimension, an annular outward flange 313 which is formed at a lower end of the side wall portion 312, a lower cylindrical wall portion 314 which comes down from the outward flange 313, wings 315 which lead to the outward flange 313 through the lower cylindrical wall 314, and an annular bottom wall portion 316 which connects with the lower cylindrical wall 314 through lower ends of the wings 315. The upper wall 311 has a center hole 311A. As shown in FIG. 7 or FIG. 8, a partially cylindrical support wall 317 is provided radially inward of the cylindrical side wall portion 312, connecting with the upper wall 311 and the bottom wall portion 316. The support wall 317 supports a plurality of vertical linear guide rails 318 for vertical sliding movement of the second lift member 32. The wings 315 are provided at two locations to oppose to each other with the center of the outward flange 313 in between, and in front of respective openings 12A made in the housing 1A of the fixed base 1. As shown in FIG. 8 or FIG. 9, the wings 315 are provided with a plurality of guide members 319. These guide members 319 are slidable vertically on the linear guide rails 14 which are provided on the side wall portion 12 of the fixed base 1. The cylindrical side wall portion 312 has a smaller outer diameter than the center hole 13A in the ceiling wall portion 13 of the center hole 13A. With this arrangement, the first lift member 31 is movable relative to the fixed base 1 vertically as in the figure within a predetermined range, with the cylindrical side wall portion 312 of the first lift member 31 moving in and out of the center hole 13A of the housing 1A.

The cylindrical side wall portion 312 of the lift member 31 is surrounded by a bellows 360, which has its two ends fixed to the ceiling wall portion 13 of the fixed base 1 and to the outward flange 313 of the first lift member 31. The bellows 360 maintains air-tight sealing between the ceiling wall portion 13 of the fixed base 1 and the outward flange 313 of the first lift member 31 regardless of the vertical movement of the first lift member 31.

The first lift drive mechanism 33, which raises and lowers the first lift member 31 relative to the fixed base 1, is provided by a ball screw mechanism 330 as shown in FIG. 5, which is composed of a vertical threaded shaft 331 and a nut 332 threaded onto the threaded shafts 331. Preferably, a plurality of the ball screw mechanisms 330 are provided: In the present embodiment, two sets of the ball screw mechanisms 330 are provided. These ball screw mechanisms 330 oppose to each other, with the swivel axis Os in between and at substantially the same distance from the swivel axis Os.

Each threaded shaft 331 is rotatably supported by the bottom wall portion 11 of the fixed base 1 via a bearing 333. Each nut 332 is fixed to an outer circumference on the wing 315 of the first lift member 31. The two threaded shafts 331 have their respective lower end provided with pulleys 334, and a belt 335 routed around these pulleys connects the shafts with a first drive power source or a motor M1. Thus, as the motor M1 drives, the two threaded shafts 331 are rotated in synchronization in a normal or a reverse direction. By rotating the two threaded shafts 331 as described, the first lift member 31 is raised and lowered. It should be noted here that the ball screw mechanisms 330 which raise and lower the first lift member 31 are disposed substantially evenly in a circumferential direction of the swivel axis Os, and therefore it is possible to raise and lower the first lift member 31 smoothly.

As shown in FIG. 5, the second lift member 32 includes a cylindrical inner side wall portion 321 which has a predetermined vertical dimension, a cylindrical outer side wall portion 322, and a bottom wall portion 323 which connects lower ends of these side wall portions 321, 322. The inner side wall portion 321 has its upper portion provided with a cylindrical housing 324 integrally therewith. As shown in FIG. 5 and FIG. 8, a plurality of guide members 325 are provided on the outer side wall portion 322. These guide members 325 are slidable vertically on the linear guide rails 318 which are provided on the support wall 317 of the first lift member 31. The inner side wall portion 322 has a smaller outer diameter than the center hole 311A in the upper wall portion 311 of the first lift member 31. With this arrangement, the second lift member 32 is movable relative to the first lift member vertically as in the figure within a predetermined range, with the inner side wall portion 321 of the second lift member 32 moving in and out of the center hole 311A of the first lift member 31.

The inner side wall portion 321 of the second lift member 32 is surrounded by a bellows 370, which has its two ends fixed to the upper wall portion 311 of the first lift member 31 and to the bottom wall portion 323 of the second lift member 32. The bellows 370 maintains air-tight sealing between the upper wall portion 311 of the first lift member 31 and the bottom wall portion 323 of the second lift member 32 regardless of the vertical movement of the first lift member 31.

Figure 10:
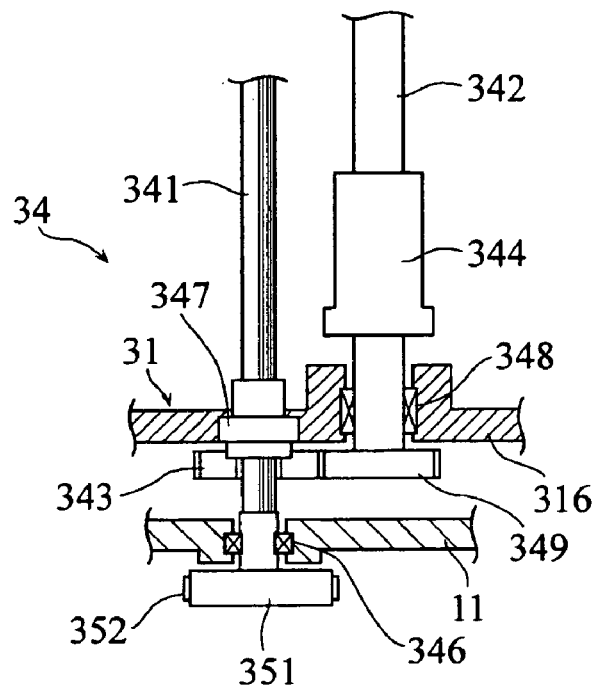
FIG. 10 is an enlarged partial sectional view taken along lines X-X in FIG. 8 for describing a second lift drive mechanism.

The second lift drive mechanism 34 raises and lowers the second lift member 32 relative to the first lift member 31 while allowing the first lift member 31 to be raised and lowered relative to the fixed base 1. As shown in FIG. 7, FIG. 8 or FIG. 10, the second lift drive mechanism 34 includes a vertical rotation shaft 341, a threaded shaft 342 disposed in parallel to the rotation shaft 341, a gear 343 which transmits rotation of the rotation shaft 341 to the threaded shaft 342, and a nut 344 threaded onto the threaded shaft 342. The threaded shaft 342 and the nut 344 constitute a ball screw mechanism.

As shown clearly in FIG. 10, the rotation shaft 341 is a spline shaft which is supported rotatably on the bottom wall portion 11 of the fixed base 1 via a bearing 346. The gear 343, whose inner circumference is formed as a spline boss, is fitted around the rotation shaft 341 slidably thereto in vertical direction, but not rotatable around the shaft. On the other hand, the gear 343 is fitted to and supported by a spline bearing 347 which penetrates and is supported by the bottom wall portion 316 of the first lift member 31. Because of this structure, the gear 343 is not movable in vertical direction (axially), relatively to the bottom wall portion 316.

The threaded shaft 342 is rotatably supported by the bottom wall portion 316 of the first lift member 31 via a bearing 348. A gear 349 is provided at a lower end of threaded shaft 342. The gear 349 engages with the gear 343. The nut 344 is fixed to an outer circumference on the outer side wall portion 322 of the second lift member 32. The rotation shaft 341 has its lower end provided with a pulley 351, and a belt 352 routed around the pulley connects the shaft with a second drive power source or a motor M2 (See FIG. 7 and FIG. 8). Thus, as the motor M2 drives, the rotation shaft 341 is rotated in a normal or a reverse direction. The rotation is transmitted by the gears 343, 349 to the threaded shaft 342, and as the threaded shaft 342 is rotated, the second lift member 32 is raised or lowered. As has been described earlier, the gear 343 is not vertically movable relative to the first lift member 31 yet vertically slidable relative to the rotation shaft 341. Therefore, as the rotation shaft 341 is rotated, the second lift member 32 is raised or lowered relatively to the first lift member 31 regardless of the vertical position of the first lift member 31.

As shown in FIG. 5, the swivel 2 includes a top plate 21 and a cylindrical shaft 22 which extends downward from the top plate and is integral therewith. The cylindrical shaft 22 is rotatably supported inside the housing 324 of the second lift member 32, via bearing 23 about the swivel axis Os. The housing 324 also supports an annular, speed reducer 25. The speed reducer 25 has an input shaft fitted to a gear 26. The speed reducer 25 has its output shaft connected with a lower end of the cylindrical shaft 22.

A sealing mechanism 24 is fitted between the housing 324 and the cylindrical shaft 22, above the bearing 23. The sealing mechanism 24 seals a space above the sealing mechanism 24 from a space below the sealing mechanism 24, thereby maintains air-tightness.

Figure 11:
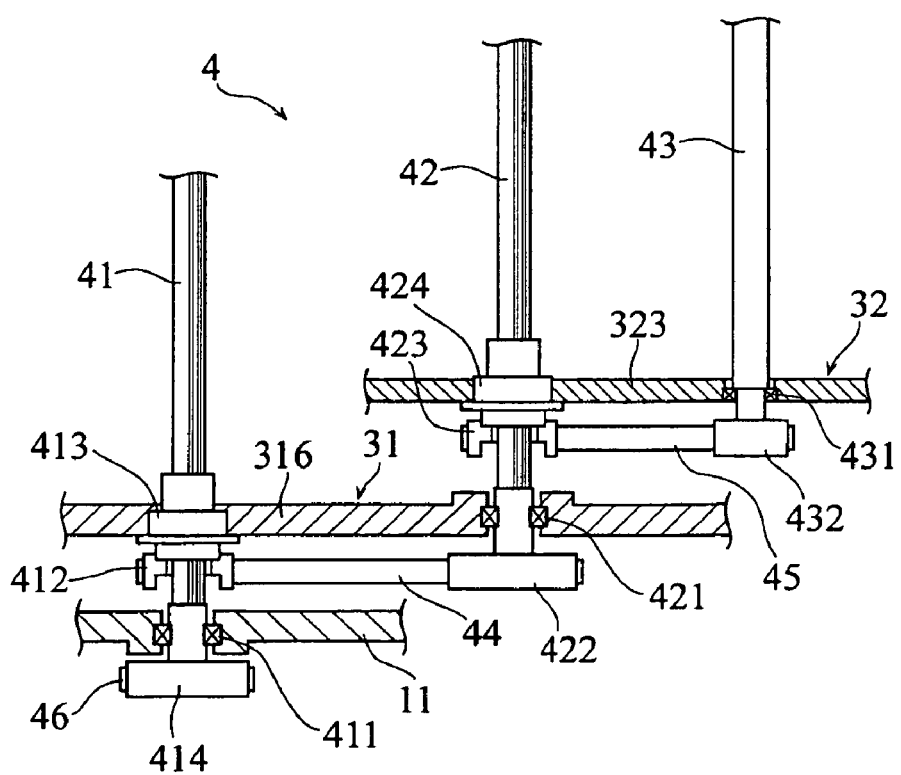
FIG. 11 is an enlarged partial sectional view taken along lines XI-XI in FIG. 8 for describing a swivel mechanism.

The swivel mechanism 4 turns the swivel 2 about the swivel axis Os regardless of the vertical position of the first or the second lift members 31, 32, and includes as shown in FIG. 8, FIG. 9 or FIG. 11, a vertical primary rotation shaft 41, a secondary rotation shaft 42 disposed in parallel to the primary rotation shaft 41, and a driving rotation shaft 43 disposed in parallel to the secondary rotation shaft 42.

As shown clearly in FIG. 11, the primary rotation shaft 41 is a spline shaft which is supported rotatably on the bottom wall portion 11 of the fixed base 1 via a bearing 411. A pulley 412, whose inner circumference is formed as a spline boss, is fitted around the primary rotation shaft 41. The pulley 412 is slidable in vertical direction relative to the primary rotation shaft 41, but not rotatable around the shaft. On the other hand, the pulley 412 is fitted to and supported by a spline bearing 413 which penetrates and is supported by the bottom wall portion 316 of the first lift member 31. Because of this structure, the pulley 412 is not movable in vertical direction relatively to the bottom wall portion 316.

The secondary rotation shaft 42 is a spline shaft, and is supported rotatably by the bottom wall portion 316 of the first lift member 31 via a bearing 421. As shown in FIG. 9, the secondary rotation shaft 42 has its upper end supported rotatably by a cylindrical support tube 326 which extends down from the upper wall 311 of the first lift member 31. The secondary rotation shaft 42 has its lower end provided with a pulley 422. The pulley 422 and the pulley 412 which is fitted around the primary rotation shaft 41 are connected by a belt 44. As shown in FIG. 9 or FIG. 11, the secondary rotation shaft 42 is also fitted with a pulley 423 whose inner circumference is formed as a spline boss. The pulley 423 is slidable vertically relative to the secondary rotation shaft 42 but not rotatable around the shaft. On the other hand, the pulley 423 is fitted to and supported by a spline bearing 424 which penetrates and is supported by the bottom wall portion 323 of the second lift member 32. Because of this structure, the pulley 423 is not movable in vertical direction relatively to the bottom wall portion 323.

The driving rotation shaft 43 is rotatably supported by the bottom wall portion. 323 of the second lift member 32 via a bearing 431. The driving rotation shaft 43 has a lower end provided with a pulley 432, and a belt 45 is routed around the pulley 432 and the pulley 423 which is fitted around the secondary rotation shaft 42. As shown in FIG. 7, the driving rotation shaft 43 has its upper end provided with a gear 433.

The gear 433 engages with the gear 26 which is fitted to the input shaft of the speed reducer 25.

As shown in FIG. 8 or FIG. 11, the primary rotation shaft 41 has a lower end provided with a pulley 414, and a belt 46 routed around the pulley connects the shaft 41 with a motor M3. Thus, as the motor M3 drives, the primary rotation shaft 41 is rotated, and the rotation is transmitted via the pulleys 412, 422 and the belt 44, to the secondary rotation shaft 42. As has been described earlier, the pulley 412 is not movable vertically relative to the first lift member 31, yet slidable vertically relative to the primary rotation shaft 41. Thus, as the primary rotation shaft 41 rotates, the secondary rotation shaft 42 is rotated regardless of the vertical position of the first lift member 31. Likewise, as the secondary rotation shaft 42 rotates, the driving rotation shaft 43 is rotated via the pulleys 423, 432 and a belt 45, and then the cylindrical shaft 22 of the swivel 2 is rotated via the gear 433, 26 and the speed reducer 25. Therefore, as the motor M3 drives, the swivel 2 is rotated about the swivel axis Os regardless of the vertical positions of the first and the second lift members 31, 32.

The linear movement mechanisms 5 move the hands 6A, 6B along a linear, horizontal travel stroke GL, and include as shown in FIG. 5, a guide member 51, guide rails 52A, 52B provided on the guide member 51, a first and a second horizontal drive mechanisms 53A, 53B which transmit horizontal driving force to the hands 6A, 6B, and a first through a fourth transmission shafts 541, 542, 543, 544 which transmit driving power to these horizontal drive mechanisms 53A, 53B.

The guide member 51 has a long rectangular shape as in a plan view, with a horizontal, longitudinal axis (travel stroke GL), and includes a bottom wall 511, side walls 512, a middle wall 513, and a cover 514. The guide member 51 is supported integrally by the top plate 21 of the swivel 2 and rotated therewith as the swivel 2 is rotated. A pair of inner guide rails 52A are supported by the middle wall 513. The hand 6A is supported by the pair of guide rails 52A via support arms 61a and sliders 521A. A pair of outer guide rails 52B are supported by the side walls 512. The hand 6B detours the sides of the hand 6A and is supported by the pair of guide rails 52B via support arms 61b and sliders 521B. All of the guide rails 52A, 52B are covered by the cover 514 from above. The support arms 61a of the hand 6A penetrate slits 514a made in an upper surface of the cover 514. The support arms 61a are provided with a connecting member 62a. The connecting member 62a penetrates a slit in the middle wall 513, and is attached to an output belt 534 of the first horizontal drive mechanism 53A to be described later. On the other hand, the support arms 61b of the hand 6B penetrates a slits 514b made in side surfaces of the cover 514. The support arms 61b are provided with a connecting member 62b. The connecting member 62b penetrates a slit in the middle wall 513, and is attached to an output belt 534 of the second horizontal drive mechanism 53B.

Figure 2:
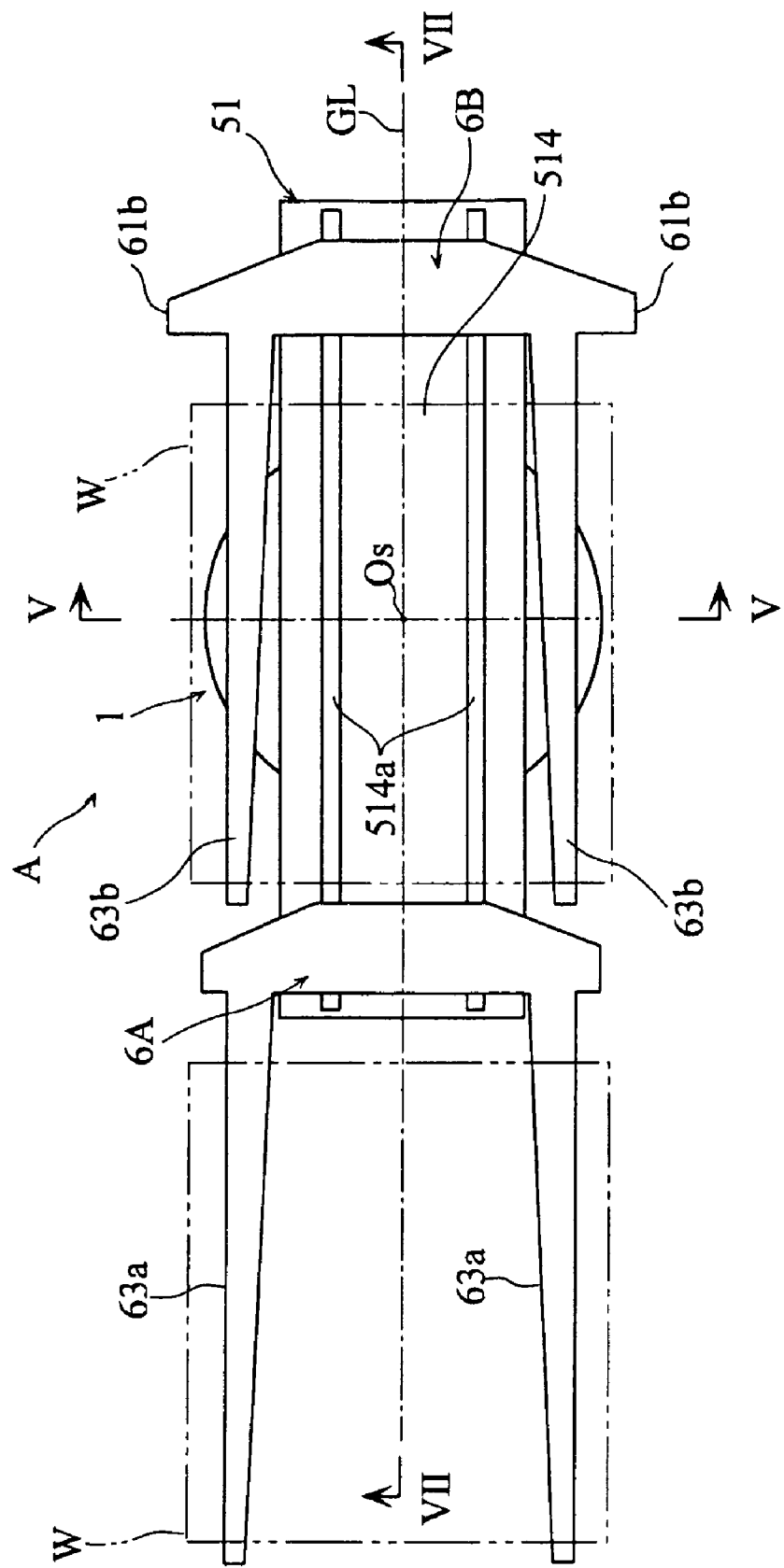
FIG. 2 is a plan view of the transfer apparatus in FIG. 1.
Figure 3:
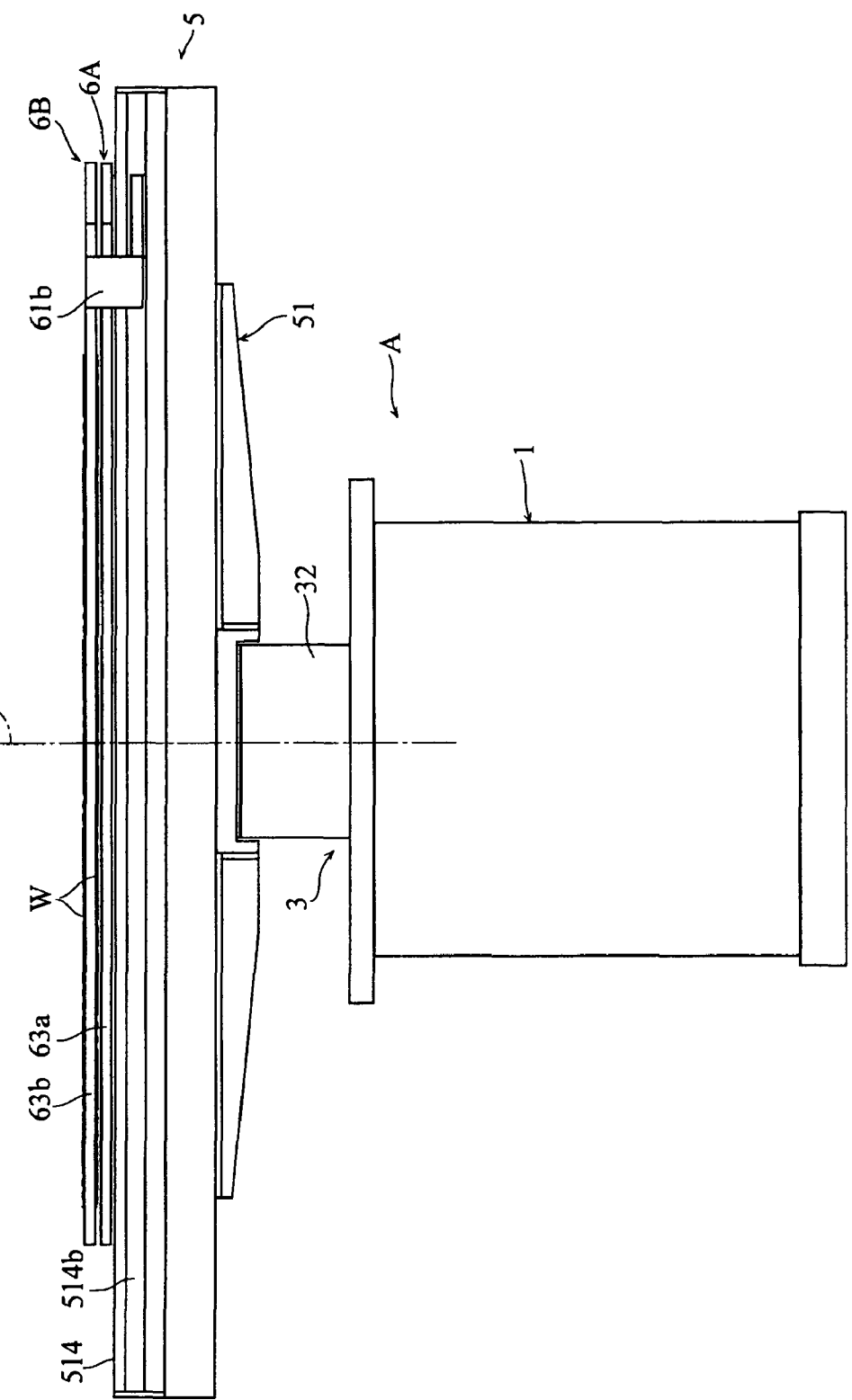
FIG. 3 is a side view of the transfer apparatus in FIG. 1.
Figure 4:
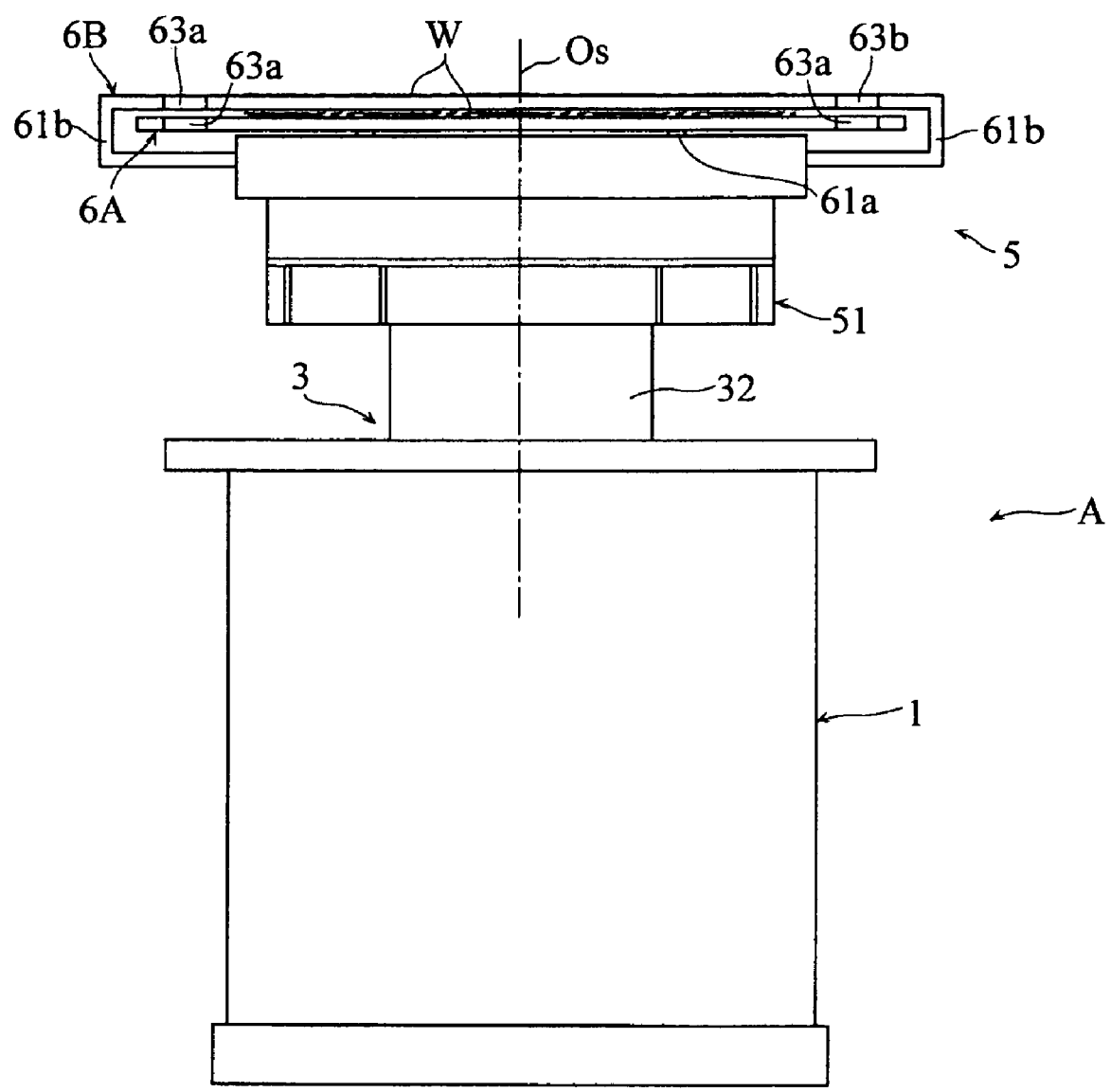
FIG. 4 is a front view of the transfer apparatus in FIG. 1.

As shown clearly in FIG. 1 through FIG. 3, the hands 6A, 6B include fork-like fingers 63a, 63b formed integrally therewith and extending longitudinally of the guide member 51. The thin platy works W are placed on these fingers 63a, 63b. It should be noted here that FIG. 3 and the drawings thereafter illustrates both of the hands 6A, 6B as positioned above the fixed base 1 unlike in FIG. 1 and FIG. 2.

As shown in FIG. 5, each of the first and the second transmission shafts 541, 542 is supported rotatably by the bottom wall portion 323 along the inner side wall portion 321 of the second lift member 32 via a bearing. The first transmission shaft 541 has a lower end provided with a gear 541a. The gear 541a engages with a gear which is fitted to an output shaft of a motor M4 supported by the bottom wall portion 323 of the second lift member 32. The second transmission shaft 542 has a lower end provided with a gear 542a. The gear 542a engages with a gear which is fitted to an output shaft of a motor M5 supported by the bottom wall portion 323.

The third and the fourth transmission shafts 543, 544 are inserted coaxially along the inner side wall portion 321 of the second lift member 32 through the bottom wall 511 of the guide member 51. More specifically, as shown clearly in FIG. 6, the third transmission shaft 543 is a cylindrical shaft, and is supported rotatably by a bearing 211 which is fixed to the inner side wall portion 321 of the second lift member 32 and the top plate 21 of the swivel 2. Inside the third transmission shaft 543, the fourth transmission shaft 544 is supported rotatably via a bearing. The fourth transmission shaft 544 has a lower end provided with a gear 544a. The gear 544a engages with a gear 542b provided at an upper end of the second transmission shaft 542. The third transmission shaft 543 has a lower end provided with a gear 543a. The gear 543a engages with a gear 541b provided at an upper end of the first transmission shaft 541.

The first and the second horizontal drive mechanisms 53A, 53B respectively move the hands 6A, 6B independently from each other along the travel stroke GL. The first and the second horizontal drive mechanisms 53A, 53B have a similar composition to each other, so the following description will only cover the composition of the first horizontal drive mechanism 53A, and where appropriate, description of the second horizontal drive mechanism 53B will be skipped.

Figure 6:
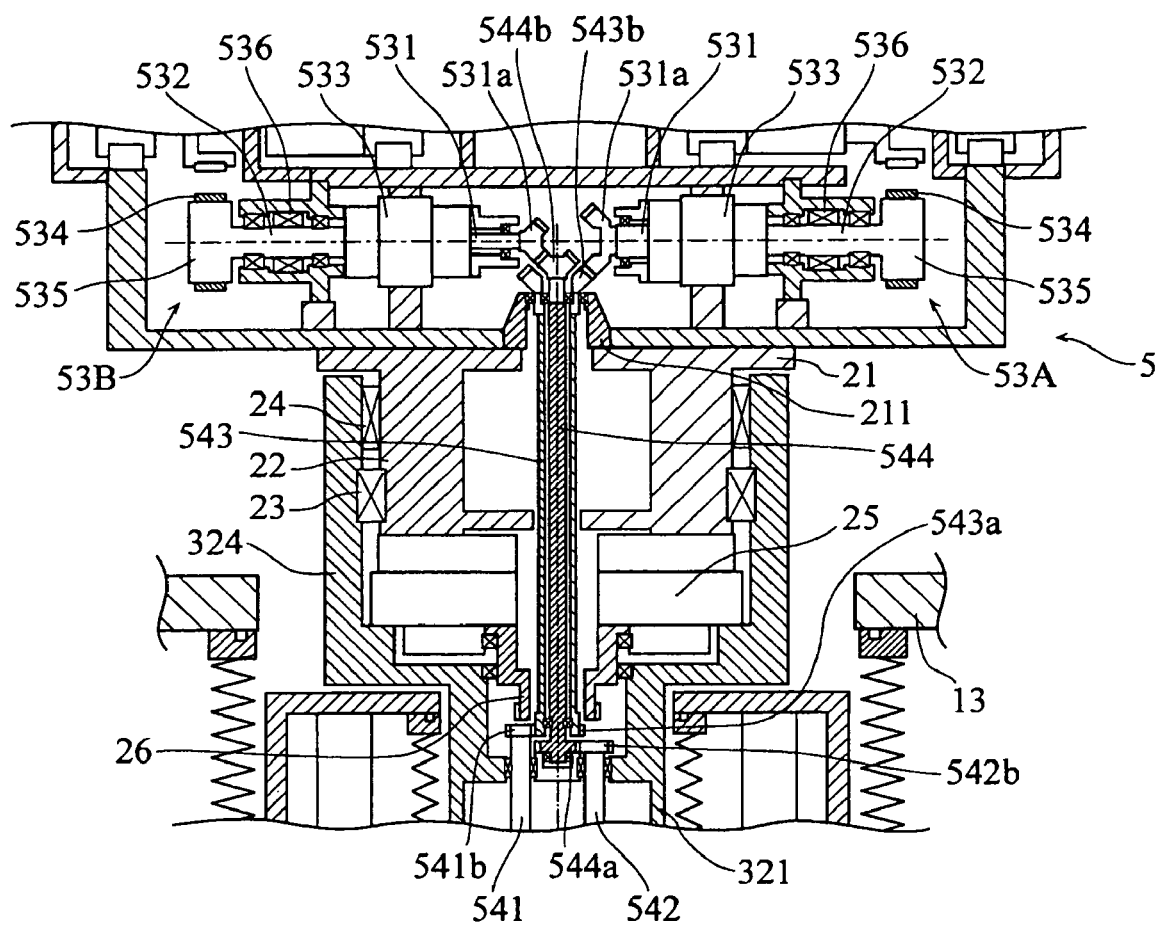
FIG. 6 is an enlarged partial view of FIG. 5.

As shown in FIG. 5 or FIG. 6, the first horizontal drive mechanism 53A includes transmission shafts 531, 532, a speed reducer 533, and an output belt 534, and is housed in the guide member 51. The transmission shaft 531 is supported rotatably via a bearing. The transmission shaft 531 has an end (the left side as in the figure) provided with a bevel gear 531a. The bevel gear 531 engages with a bevel gear 543b which is provided at an upper end of the third transmission shaft 543. The transmission shaft 531 has another end connected with an input shaft of the speed reducer 533. The transmission shaft 532 has an end connected with an output shaft of the speed reducer 533. The transmission shaft 532 has another end (the right side as in the figure) provided with a drive pulley 535. Note that a sealing mechanism 536 is inserted between the transmission shaft 532 and the guide member 51. With the sealing mechanism 536, an inner space of the second lift member 32 which is continuous from inside of the guide member 51 via the swivel 2 is given air-tight sealing to the outside of the guide member 51.

Figure 12:
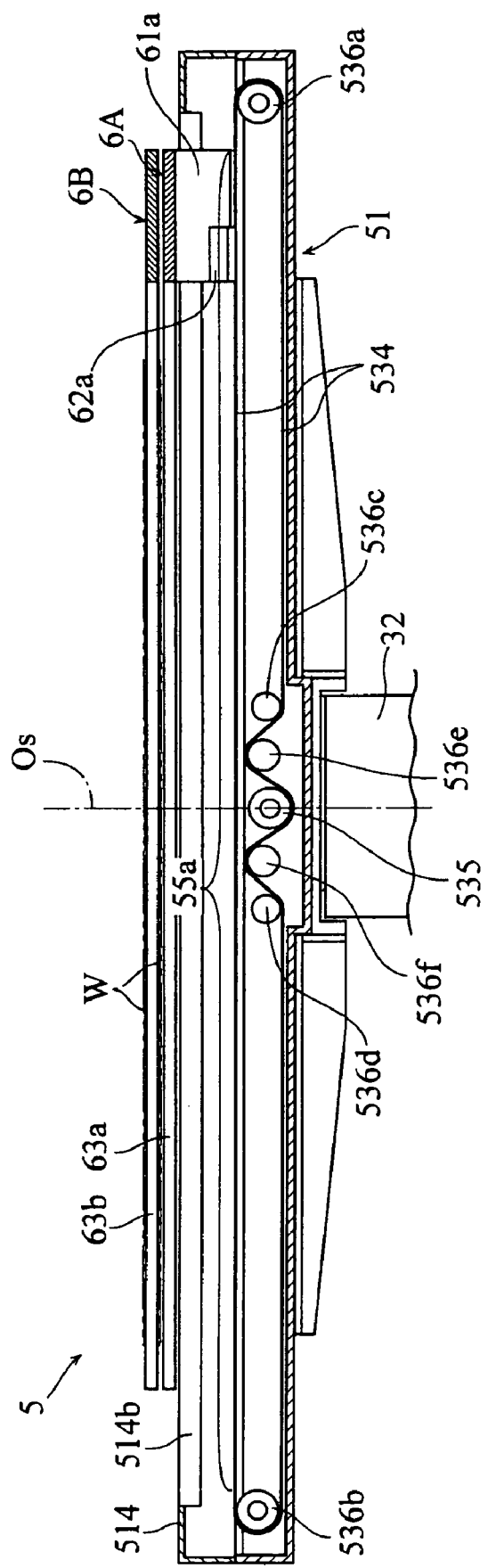
FIG. 12 is a sectional view taken along lines XII-XII in FIG. 5.

As shown in FIG. 12, the output belt 534 is routed around the drive pulley 535 and pulleys 536a through 536f. The pulleys 536a, 536b are provided near longitudinal ends of the guide member 51 (two ends along the travel stroke GL) On the other hand, pulleys 536c, 536d, 536e, 536f are provided near the drive pulley 535. Of these, the pulleys 536e, 536f are disposed outside of the output belt 534, and therefore, the output belt 534 is given an appropriate tension. With this arrangement, as a drive force from the motor M4 is transmitted to the first and the third transmission shafts 541, 543, and then to the first horizontal drive mechanism 53A, the drive pulley 535 is rotated, giving the output belt 534 a forward or a reverse movement.

The pulleys 536a, 536b are disposed along a line which is parallel to the travel stroke GL. In this layout, a region along the output belt 534 and above the pulleys 536a, 536b is defined as a section 55a which is parallel to the travel stroke GL, and the output belt 534 can make reciprocating movement in this section. In the section 55a, the output belt 534 has a predetermined portion connected with the connecting member 62a which extends from the support arm 61a of the hand 6A. Thus, the hand 6A is reciprocable by the horizontal drive mechanism 53A, along the travel stroke GL.

As shown in FIG. 6, in the second horizontal drive mechanism 53B, the transmission shaft 531 has an end (the right side as in the figure) provided with a bevel gear 531a. The bevel gear 531a engages with a bevel gear 544b which is provided at an upper end of the fourth transmission shaft 544. With this arrangement, as a drive force from the motor M5 is transmitted to the second and the fourth transmission shafts 542, 544, and then to the second horizontal drive mechanism 53B, the drive pulley 535 is rotated, giving the output belt 534 a forward or a reverse movement. The connecting member 62b which extends from the support arm 61b of the hand 6B is connected with a predetermined portion of the output belt 534. Thus, the hand 6B is reciprocable by the horizontal drive mechanism 53B, along the travel stroke GL.

The transfer apparatus A as has been described thus far is used in manufacturing processes of e.g. liquid crystal display panels, in order to move a work in and out of process chambers. When carrying a work in and out of different process chambers, the carrying process can be achieved by a chain of transportation operations for example, via a vacuum transportation module which is disposed between an atmospheric transport module and each process chamber. The vacuum transport module includes a transport chamber surrounded by a plurality of process chambers, and a load lock which connects the atmospheric transport module with the transport chamber. The transfer apparatus A according to the present embodiment is disposed in the transport chamber under a vacuum condition for example. When the transfer apparatus A transports a work W into a process chamber, the swivel 2 and the linear movement mechanism 5 supported thereby are appropriately raised or lowered, and/or swiveled by the lift mechanism 3 and the swivel mechanism 4, and is paused at a predetermined attitude, and then the linear movement mechanism 5 is operated to move the hands 6A, 6B into a selected one of the process chambers to deliver and/or receive a work W. In any of the process chambers, it is possible to raise/lower the work W to an appropriate height for the process. The transfer apparatus A also performs operations in the load lock, which is connected with the atmospheric transport module, to receive works which have finished a process cycle and to deliver works to be processed next. In the load lock, there is a stage for placing a work. The stage sometimes has three or more tiers for a purpose of improved process efficiency for example. In such a case, a relatively large raising/lowering operation stroke is required in order to perform the work delivery/pick-up operation in the load lock.

As has been described earlier, the transfer apparatus A includes a lift mechanism 3 which has the first and the second lift drive mechanisms 33, 34. Through the operation of the lift drive mechanisms 33, 34 the first and the second lift members 31, 32 can be extended and retracted in a telescopic manner. Thus, it is possible to provide a large moving stroke for the lifting/lowering operation while minimizing dimensional increase in the direction of height, of the fixed base 1 which accommodates the lift mechanism 3. As a result, it is possible to keep the overall height of the device short. The transfer apparatus A which is composed as described is suitable for space reduction for manufacturing equipment, increase in functional diversity and improved efficiency in the manufacturing process.

Further, according to the transfer apparatus A, the motors M1, M2 and M3 for driving the first and the second lift drive mechanisms 33, 34 and the swivel mechanism 4 are disposed near the bottom of the fixed base 1 in an efficient manner along the circumferential edge. Such an innovation prevents these motors M1, M2, M3 from interfering with the raising/lowering operation by the first and the second lift members 31, 32. Such an arrangement is suitable in providing a large stroke for the raising/lowering operation as well as in keeping the overall height of the transfer apparatus A short.

According to the transfer apparatus A, bellows 360, 370 and sealing mechanism 24, 536 are provided at appropriate places. Therefore, when the device is used under a vacuum condition, it is possible to maintain an atmospheric condition near the bottom of the fixed base 1 where the motors are located, regardless of the operating motion by relevant members due to the operation of the lift mechanism 3, the swivel mechanism 4 and the linear movement mechanism 5. Further, the motors, etc. are exposed to openings 12A which are made in the side wall portion 12 of the fixed base, so it is easy to provide maintenance to these components.

An embodiment of the present invention being thus far described, it should be understood that the scope of the present invention is not limited to the embodiment recited above. Specific details of the transfer apparatus according to the present invention may be varied in many different ways within the spirit of the present invention.

For example, in the embodiment, description was made for a structure composed by lift members arranged in two stages as a telescopic lift mechanism. However, the present invention is not limited to this, and the device may have lift members arranged in three or more stages.

Further, the linear movement mechanism utilized in the present embodiment is a belt drive mechanism. However, a link arm mechanism, for example, may be used instead. The hand, on which a work is placed, may not necessarily be two like the hands 6A, 6B as in the embodiment, but the device may use a so-called single-hand configuration for example.

The embodiment was described under an assumption that the device will be used in a vacuum condition. Obviously, however, the transfer apparatus according to the present invention may be made for use under an atmospheric condition.

The invention claimed is:
1. A transfer apparatus comprising:
a fixed base;
a swivel;
a lift mechanism for raising and lowering the swivel relative to the fixed base;
a swivel mechanism for turning the swivel about a vertical swivel axis;
a linear movement mechanism supported by the swivel; and
a hand supported by the linear movement mechanism for transportation of a work along a linear horizontal travel stroke;
wherein the lift mechanism includes N (N is an integer≧2) lift members arranged for telescopic expansion and retraction relative to the fixed base, and N drive motors each for raising and lowering a respective one of the lift members relative to the other lift member or members,
wherein the swivel is supported by an uppermost one of the lift members;
wherein the lift mechanism has a two-stage construction including a lower-stage first lift member and an upper-stage second lift member, the lift mechanism including a first lift drive mechanism for raising and lowering the first lift member relative to the fixed base, and a second lift drive mechanism for raising and lowering the second lift member relative to the first lift member while allowing the first lift member to be raised and lowered relative to the fixed base; and wherein the swivel mechanism includes:

a primary rotation shaft supported by the fixed base, a secondary rotation shaft supported in parallel to the primary rotation shaft by the first lift member;

a drive rotation shaft supported in parallel to the secondary rotation shaft by the second lift member;

a first transmission member held by the first lift member incapably of axial relative movement thereto, around the primary rotation shaft incapably of relative rotation but capably of relative axial movement thereto, for transmission of rotation of the primary rotation shaft to the secondary rotation shaft; and a second transmission member held by the second lift member incapably of axial relative rotation thereto, around the secondary rotation shaft incapably of relative rotation but capably of relative axial movement thereto, for transmission of rotation of the secondary rotation shaft to the drive rotation shaft.

2. The transfer apparatus according to claim 1, wherein the first lift drive mechanism includes a vertical threaded shaft supported by the fixed base and a nut threaded on the threaded shaft and integral with the first lift member.

3. The transfer apparatus according to claim 2, wherein the second lift drive mechanism includes: a rotation shaft supported by the fixed base; a threaded shaft supported in parallel to the rotation shaft by the first lift member; a transmission member held at a lower end of the first lift member incapably of axial relative movement thereto, around the rotation shaft incapably of relative rotation but capably of relative axial movement thereto, for transmission of rotation of the rotation shaft to the threaded shaft; and a nut threaded on the threaded shaft and being integral with the second lift member.

4. The transfer apparatus according to claim 3, wherein the rotation shaft is provided by a spline shaft, the transmission member having a spline boss to be fitted by the spline shaft.

5. The transfer apparatus according to claim 3, wherein the fixed base is provided with a first and a second drive power sources near a bottom for driving the first and the second lift drive mechanisms.

6. The transfer apparatus according to claim 5, wherein the threaded shaft of the first lift drive mechanism has a lower end provided with a pulley, and is connected with the first drive power source via a belt routed around the pulley.

7. The transfer apparatus according to claim 5, wherein the rotation shaft of the second lift drive mechanism has a lower end provided with a pulley, and is connected with the second drive power source via a belt routed around the pulley.

8. The transfer apparatus according to claim 2, wherein the first lift drive mechanism includes a plurality of threaded shafts, the threaded shafts being disposed substantially in uniform dispersion in a circumferential direction of the swivel axis, the first lift member being provided with a plurality of nuts corresponding to the threaded shafts.

9. The transfer apparatus according to claim 1, further comprising a first bellows and a second bellows, wherein the first bellows is provided between the fixed base and the first lift member for air-tight sealing between the fixed base and the first lift member regardless of the raising/lowering movement of the first lift member relative to the fixed base, and wherein the second bellow is provided between the first lift member and the second lift member for air-tight sealing between the first lift member and the second lift member regardless of the raising/lowering movement of the second lift member relative to the first lift member.

10. A transfer apparatus comprising:

a fixed base;

a work holder for holding and transporting a work; and a lift mechanism for raising and lowering the work holder relative to the fixed base;

wherein the lift mechanism includes a plurality of lift members arranged for telescopic expansion and retraction relative to the fixed base, and a plurality of lift drive mechanisms each for raising and lowering a respective one of the lift members relative to the fixed base, wherein the work holder is supported by an uppermost one of the lift members;

wherein the plurality of lift members include a first lift member and a second lift member, the plurality of lift drive mechanisms include a first lift drive mechanism for raising and lowering the first lift member relative to the fixed base, and a second lift drive mechanism for raising and lowering the second lift member relative to the first lift member while allowing the first lift member to be raised and lowered relative to the fixed base; and wherein the second lift drive mechanism includes a rotation shaft rotatably supported by the fixed base, a threaded shaft rotatably supported by the first lift member in parallel to the rotation shaft, a transmission member carried by the first lift member and mounted non-rotatably but slidably around the rotation shaft for transmission of rotation of the rotation shaft to the threaded shaft, and a nut threaded on the threaded shaft and carried by the second lift member.

11. The transfer apparatus according to claim 10, wherein the rotation shaft is provided by a spline shaft, the transmission member having a spline boss to be fitted on the spline shaft.

12. The transfer apparatus according to claim 10, wherein the fixed base is provided with a first and a second drive power sources for driving the first and the second lift drive mechanisms.

13. The transfer apparatus according to claim 12, wherein the first lift drive mechanism includes a threaded shaft provided with a pulley that is connected with the first drive power source via a belt.

14. The transfer apparatus according to claim 12, wherein the rotation shaft of the second lift drive mechanism is provided with a pulley that is connected with the second drive power source via a belt.

15. A transfer apparatus comprising:

a fixed base;

a swivel; and a lift mechanism for raising and lowering the swivel relative to the fixed base;

a swivel mechanism for turning the swivel about a vertical swivel axis;

a work holder supported by the swivel for transportation of a work;

wherein the lift mechanism includes a plurality of lift members arranged for telescopic expansion and retraction relative to the fixed base, and a plurality of lift drive mechanisms each for raising and lowering a respective one of the lift members relative to the fixed base, wherein the swivel is supported by an uppermost one of the lift members;

wherein the plurality of lift members include a first lift member and a second lift member, the plurality of lift drive mechanisms include a first lift drive mechanism for raising and lowering the first lift member relative to the fixed base, and a second lift drive mechanism for raising and lowering the second lift member relative to the first lift member while allowing the first lift member to be raised and lowered relative to the fixed base; and wherein the swivel mechanism includes: a primary rotation shaft rotatably supported by the fixed base; a secondary rotation shaft rotatably supported by the first lift member in parallel to the primary rotation shaft; a drive rotation shaft rotatably supported by the second lift member in parallel to the secondary rotation shaft; a first transmission member carried by the first lift member and mounted non-rotatably but slidably around the primary rotation shaft for transmission of rotation of the primary rotation shaft to the secondary rotation shaft; and a second transmission member carried by the second lift member and mounted non-rotatably but slidably around the secondary rotation shaft for transmission of rotation of the secondary rotation shaft to the drive rotation shaft.

\* \* \* \* \*